(12) United States Patent
Yu

(10) Patent No.: US 7,430,268 B2
(45) Date of Patent: Sep. 30, 2008

(54) DYNAMIC SHIFT REGISTER WITH BUILT-IN DISABLE CIRCUIT

(75) Inventor: Jian-Shen Yu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 96 days.

(21) Appl. No.: 11/327,245

(22) Filed: Jan. 5, 2006

(65) Prior Publication Data
US 2007/0153967 A1   Jul. 5, 2007

(51) Int. Cl.
*G11C 19/00* (2006.01)

(52) U.S. Cl. .............................. 377/64; 377/68; 377/70; 377/72; 377/74

(58) Field of Classification Search ........................ None
See application file for complete search history.

(56) References Cited

U.S. PATENT DOCUMENTS

| | | | |
|---|---|---|---|
| 5,434,899 A | 7/1995 | Huq et al. | |
| 6,339,631 B1 | 1/2002 | Yeo et al. | |
| 6,556,646 B1 | 4/2003 | Yeo et al. | |
| 6,690,347 B2* | 2/2004 | Jeon et al. .................... | 345/100 |
| 6,778,626 B2 | 8/2004 | Yu | |
| 6,778,627 B2 | 8/2004 | Yu | |
| 6,834,095 B2 | 12/2004 | Yu | |
| 6,845,140 B2 | 1/2005 | Moon et al. | |
| 6,885,723 B2 | 4/2005 | Yu | |
| 6,891,916 B2 | 5/2005 | Park et al. | |
| 7,027,550 B2* | 4/2006 | Lin .............................. | 377/64 |
| 7,203,264 B2* | 4/2007 | Lo et al. ........................ | 377/64 |
| 2004/0239608 A1* | 12/2004 | Chung ......................... | 345/100 |
| 2007/0019775 A1* | 1/2007 | Tsai et al. ..................... | 377/64 |
| 2007/0071158 A1* | 3/2007 | Wei et al. ...................... | 377/64 |
| 2007/0086558 A1* | 4/2007 | Wei et al. ...................... | 377/64 |

* cited by examiner

*Primary Examiner*—Tuan T Lam
(74) *Attorney, Agent, or Firm*—Morris, Manning & Martin LLP; Tim Tingkang Xia

(57) ABSTRACT

A disable circuit for using in a dynamic shift register unit comprising: a first input, a second input, an output, a first reference line for receiving a first supply voltage, a second reference line for receiving a second supply voltage, and six transistors. The disable circuit is capable of being coupled with a dynamic shift register unit having an input for receiving an input pulse and an output for outputting a shifted pulse. The disable circuit generates an output signal during an input pulse period or an output pulse period for the dynamic shift register unit, wherein the input pulse period and the output pulse period are responsive to a first input pulsed signal from the first input and a second input pulsed signal from the second input, respectively.

8 Claims, 12 Drawing Sheets

DYNAMIC SHIFT REGISTER WITH BUILT-IN DISABLE CIRCUIT

FIELD OF THE INVENTION

The present invention relates generally to a shift register, and more particularly, to a dynamic shift register stage, of a shift register, having a built-in disable circuit for a display.

BACKGROUND OF THE INVENTION

A frame of displays, such as a liquid crystal display (hereinafter "LCD"), an electroluminescent display, or an organic light emitting diode display, etc, is generated by a plurality of pixels of matrices. Thus, sequential pulses are basic signals driving the display. In addition, the sequential pulses are generated by a shift register circuit, so the shift register circuit becomes a general unit for the driving circuit of a display.

FIG. 11 shows a conventional shift-register circuit as disclosed by U.S. Pat. No. 5,434,899, issued to Huq et al. In shift register 1100 of FIG. 11(*a*), stages n−1, n, n+1 and n+2 are coupled to one another in a cascade configuration. An output signal of a given stage is coupled to an input of the immediately subsequent stage in the cascade configuration. For example, an output pulse $OUT_{n-1}$ of a preceding stage n−1 in the cascade configuration of register 1100 is coupled to an input terminal 12 of stage n of the detail shift register circuit as shown in FIG. 11(*b*). Illustratively, only four stages, n−1, n, n+1 and n+2 are shown. However, the total number of stages n in the cascade configuration of the register 1100 is substantially larger. A clock generator 1101 of FIG. 11(*a*) generates a three-phase clock signal C1, C2 and C3 as shown in FIG. 12.

As illustrated in FIGS. 11 and 12, the pulse of signal $OUT_{n-1}$ of FIG. 11(*a*) is produced when the pulse of clock signal C3 is applied to stage n−1. Signal $OUT_{n-1}$ of FIG. 11(*b*) is developed at an input terminal 12 of stage n. Signal $OUT_{n-1}$ at the HIGH voltage level is coupled via transistor 18 operating as a switch to a terminal 18*a* for developing a control signal P1. Signal P1 at the HIGH voltage level is temporarily stored in an inter-electrode capacitance, not shown, and in a capacitor CB. Signal P1 that is developed at the gate of an output transistor 16 of FIG. 11(*b*) conditions output transistor 16 for conduction. When clock signal C1 occurs, signal C1 that is developed at a terminal 14 of FIG. 11(*b*) or source electrode of transistor 16 is coupled via an inter-electrode capacitance CP in phantom and capacitance CB to the gate electrode of transistor 16, or terminal 18*a*, for turning on the conditioned transistor 16. Consequently, an output pulse signal $OUT_n$ is developed at a drain terminal 13. Signal $OUT_n$ is applied to the input of subsequent stage n+1 of FIG. 11(*a*). Stage n+1 operates similarly to stage n except for utilizing clock signal C2, instead of clock signal C1 in stage n, for turning on the corresponding transistor.

A transistor 25 has its drain-source conduction path coupled between terminal 18*a* and a point of reference potential sufficient to turn pull-up transistor 16 off when the transistor 25 is conductive. The gate of the transistor 25 is coupled to an output of subsequent stage n+2 in the chain as shown in FIG. 11(*a*) and is controlled by an output signal $OUT_{n+2}$.

However, such a conventional shift register stage is enabled by the output signal of the prior stage and is disabled either by a control signal or by the output signal of a subsequent stage. The first disable method costs one applied signal source. The second disable method has cross stage connection wiring. In the conventional shift register circuit discussed above, the dynamic shift register stage n is disabled by a shift register stage after the next, i.e., shift register stage n+2. The circuit layout of the conventional shift register circuit is complicated by the additional required feedback. The cross stage wiring may also cause instability of the shift register circuitry.

Therefore, a heretofore unaddressed need exists in the art to address the aforementioned deficiencies and inadequacies.

SUMMARY OF THE INVENTION

The present invention, in one aspect, relates to a disable circuit. In one embodiment, the disable circuit comprises: a first input, a second input, an output, a first reference line for receiving a first supply voltage, a second reference line for receiving a second supply voltage, and six transistors. The gate of the first transistor is coupled to the drain of the first transistor, and the drain of the first transistor is coupled to the first reference line. The gate of the second transistor is coupled to the first input. The drain of the second transistor is coupled to the source of the first transistor. The source of the second transistor is coupled to the second reference line. The gate of the third transistor is coupled to the source of the first transistor and the drain of the second transistor. The source of the third transistor is coupled to the output. The gate of the fourth transistor is coupled to the first input. The drain of the fourth transistor is coupled to the source of the third transistor and coupled to the output. The source of the fourth transistor is coupled to the second reference line. The gate of the fifth transistor is coupled to the drain of the fifth transistor. The drain of the fifth transistor is coupled to the first reference line and the source of the fifth transistor is coupled to the drain of the third transistor. The gate of the sixth transistor is coupled to the second input. The drain of the sixth transistor is coupled to the drain of the third transistor and the source of the fifth transistor. The source of the sixth transistor is coupled to the second reference line. In one embodiment, at least one of the first transistors, the second transistor, the third transistor, the fourth transistor, the fifth transistor and the sixth transistor comprises a MOS thin film transistor.

In one embodiment, the disable circuit is adapted to couple with a dynamic shift register unit having an input for receiving an input pulse and an output for outputting a shifted pulse. In another embodiment, the output of the disable circuit is adapted to couple with the dynamic shift register unit.

In another aspect, the present invention relates to a dynamic shift register. In one embodiment, the dynamic shift register comprises a plurality of dynamic shift register stages connected in serial, $\{S_N\}$, N=1, 2, . . . , M, where M is a nonzero positive integer. Each of the plurality of dynamic shift register stages, $S_N$, comprises: an input electrically connected to an output of the (N−1)-th dynamic shift register stage, $S_{N-1}$, an output electrically connected to an input of (N+1)-th dynamic shift register stage, $S_{N+1}$, a dynamic shift register unit and a disable circuit. The dynamic shift register unit comprises a first input coupled to the input of the dynamic shift register stage $S_N$ for receiving an input pulsed signal, a second input for receiving a control signal, an first output coupled to the output of the dynamic shift register stage $S_N$. The disable circuit comprises a first input coupled to the first input of the dynamic shift register unit, a second input coupled to the output of the dynamic shift register unit, and an output coupled to the second input of the dynamic shift register unit. In one embodiment, the dynamic shift register further comprises a first reference line for receiving a first supply voltage, and a second reference line for receiving a second supply voltage.

In one embodiment, the disable circuit comprises a first transistor, a second transistor, a third transistor, a fourth transistor, a fifth transistor, and a sixth transistor. The gate of the first transistor is coupled to the drain of the first transistor, and the drain of the first transistor is coupled to the first reference line. The gate of the second transistor is coupled to the first input. The drain of the second transistor is coupled to the source of the first transistor. The source of the second transistor is coupled to the second reference line. The gate of the third transistor is coupled to the source of the first transistor and the drain of the second transistor. The source of the third transistor is coupled to the output. The gate of the fourth transistor is coupled to the first input. The drain of the fourth transistor is coupled to the source of the third transistor and coupled to the output. The source of the fourth transistor is coupled to the second reference line. The gate of the fifth transistor is coupled to the drain of the fifth transistor. The drain of the fifth transistor is coupled to the first reference line and the source of the fifth transistor is coupled to the drain of the third transistor. The gate of the sixth transistor is coupled to the second input. The drain of the sixth transistor is coupled to the drain of the third transistor and the source of the fifth transistor. The source of the sixth transistor is coupled to the second reference line. In one embodiment, at least one of the first transistors, the second transistor, the third transistor, the fourth transistor, the fifth transistor and the sixth transistor comprises a MOS thin film transistor.

In one embodiment, the disable circuit is configured to generate an output signal during an input pulse period or an output pulse period for the dynamic shift register unit, wherein the input pulse period and the output pulse period are responsive to a first pulse input signal from the first input and a second pulse input signal from the second input, respectively.

In one embodiment, the dynamic shift register further comprises a clock input, and the dynamic shift register unit comprises a circuit having a first transistor, a second transistor, a third transistor, and a fourth transistor. The gate and the source of the first transistor are coupled to the first input of the dynamic shift register unit. The gate of the second transistor is coupled to the drain of the first transistor. The drain of the second transistor is coupled to the clock input. The source of the second transistor is coupled to the output of the dynamic shift register unit. The gate of the third transistor is coupled to the second input of the dynamic shift register unit. The drain of the third transistor is coupled to the gate of the second transistor. The source of the third transistor is coupled to the second reference line. The gate of the fourth transistor is coupled to the second input of the dynamic shift register unit. The drain of the fourth transistor is coupled to the output of the dynamic shift register unit. The source of the fourth transistor is coupled to the second reference line. Each dynamic shift register unit is configured to receive an input pulsed signal from the first input of the dynamic shift register unit, shift the received input pulsed signal, and output an output signal, through the output of the dynamic shift register unit. This output is to be received as input by the (N+1)-th dynamic shift register stage such that a plurality of sequentially phase shifted clock signals are generated. In one embodiment, at least one of the first transistor, the second transistor, the third transistor, and the fourth transistor comprises a MOS thin film transistor.

In another embodiment, the dynamic shift register further comprises a clock input, and the dynamic shift register unit comprises a circuit having a first transistor, a second transistor, a third transistor, and a fourth transistor. The gate and the source of the first transistor are coupled to the first input of the dynamic shift register unit. The gate of the second transistor is coupled to the drain of the first transistor. The drain of the second transistor is coupled to the clock input. The source of the second transistor is coupled to the output of the dynamic shift register unit. The gate of the third transistor is coupled to the second input of the dynamic shift register unit. The drain of the third transistor is coupled to the gate of the second transistor. The source of the second transistor is coupled to the second reference line. The gate of the fourth transistor is coupled to the second input of the dynamic shift register unit. The drain of the fourth transistor is coupled to the output of the dynamic shift register unit. The source of the fourth transistor is coupled to the second reference line. Each dynamic shift register unit is configured to receive an input pulsed signal from the first input of the dynamic shift register unit, shift the received input pulsed signal and output an output signal, through the output of the dynamic shift register unit. This output is received as input by the (N+1)-th dynamic shift register stage such that a plurality of sequentially phase shifted clock signals are generated. In one embodiment, at least one of the first transistor, the second transistor, the third transistor, and the fourth transistor comprises a MOS thin film transistor.

In one embodiment, the dynamic shift register further comprises a second clock input that is the inverse of the first clock input. In another embodiment, the first clock input and the second clock input are alternately received by the plurality of dynamic shift register stages such that if $S_N$ receives the first clock input, $S_{N+1}$ receives the second clock input, and vice versa.

In yet another aspect, the present invention relates to a dynamic shift register. In one embodiment, the dynamic shift register comprises a plurality of dynamic shift register stages connected in serial, $\{S_N\}$, N=1, 2, . . . , M, where M is a nonzero positive integer. Each of the plurality of dynamic shift register stages, $S_N$, comprises: an input electrically connectable to an output of the (N−1)-th dynamic shift register stage, $S_{N-1}$, an output electrically connectable to an input of (N+1)-th dynamic shift register stage, $S_{N+1}$, a dynamic shift register unit and a disable circuit. The dynamic shift register unit comprises a first input coupled to the input of the dynamic shift register stage $S_N$ for receiving an input pulsed signal, a second input for receiving a control signal, a first output coupled to the output of the dynamic shift register stage, $S_N$, for outputting a first shifted input pulse and a second output. The disable circuit comprises a first input coupled to the first input of the dynamic shift register unit, a second input coupled to the output of the dynamic shift register unit, and an output coupled to the second input of the dynamic shift register unit. In one embodiment, the dynamic shift register further comprises a first reference line for receiving a first supply voltage, and a second reference line for receiving a second supply voltage.

In one embodiment, the disable circuit comprises: a first transistor, a second transistor, a third transistor, a fourth transistor, a fifth transistor, and a sixth transistor. The gate of the first transistor is coupled to the drain of the first transistor, and the drain of the first transistor is coupled to the first reference line. The gate of the second transistor is coupled to the first input. The drain of the second transistor is coupled to the source of the first transistor. The source of the second transistor is coupled to the second reference line. The gate of the third transistor is coupled to the source of the first transistor and the drain of the second transistor. The source of the third transistor is coupled to the output. The gate of the fourth transistor is coupled to the first input. The drain of the fourth transistor is coupled to the source of the third transistor and coupled to the output. The source of the fourth transistor is coupled to the second reference line. The gate of the fifth transistor is coupled to the drain of the fifth transistor. The drain of the fifth transistor is coupled to the first reference line and the source of the fifth transistor is coupled to the drain of the third transistor. The gate of the sixth transistor is coupled to the second input. The drain of the sixth transistor is coupled to the drain of the third transistor and the source of the fifth transistor. The source of the sixth transistor is coupled to the second reference line. In one embodiment, at least one of the first transistors, the second transistor, the third transistor, the fourth transistor, the fifth transistor and the sixth transistor comprises a MOS thin film transistor.

In one embodiment, the disable circuit is configured to generate an output signal during an input pulse period or an output pulse period for the dynamic shift register unit, wherein the input pulse period and the output pulse period are responsive to a first pulse input signal from the first input and a second pulse input signal from the second input, respectively.

In one embodiment, the dynamic shift register further comprises a clock input, and the dynamic shift register unit comprises a circuit having a first transistor, a second transistor, a third transistor, and a fourth transistor, a fifth transistor and a sixth transistor. The gate of the first transistor is coupled to the source of the first transistor. The source of the first transistor is coupled to the first input of the dynamic shift register unit. The gate of the second transistor is coupled to the drain of the first transistor. The drain of the second transistor is coupled to the clock input. The source of the second transistor is coupled to the second output of the dynamic shift register unit. The gate of the third transistor is coupled to the second input of the dynamic shift register unit. The drain of the third transistor is coupled to the gate of the second transistor. The source of the third transistor is coupled to the second reference line. The gate of the fourth transistor is coupled to the second input of the dynamic shift register unit. The drain of the fourth transistor is coupled to the second output of the dynamic shift register unit. The source of the fourth transistor is coupled to the second reference line. The gate of the fifth transistor is coupled to the drain of the first transistor. The drain of the fifth transistor is coupled to the clock input. The source of the fifth transistor is coupled to the first output of the dynamic shift register unit. The gate of the sixth transistor is coupled to the second input of the dynamic shift register unit. The drain of the sixth transistor is coupled to the first output of the dynamic shift register unit. The source of the sixth transistor is coupled to the second reference line. Each dynamic shift register unit is configured to receive an input pulse from the first input of the dynamic shift register unit, shift the received input pulse and output the shifted pulse through the output of the dynamic shift register unit. This output is received as input by the (N+1)-th dynamic shift register stage such that a plurality of sequentially phase shifted clock signals are generated. In one embodiment, at least one of the first transistor, the second transistor, the third transistor, the fourth transistor, the fifth transistor, and the sixth transistor comprises a MOS thin film transistor.

In another embodiment, the dynamic shift register further comprises a clock input, and the dynamic shift register unit comprises a circuit having a first transistor, a second transistor, a third transistor, and a fourth transistor, a fifth transistor and a sixth transistor. The gate and the source of the first transistor are coupled to the first input. The gate of the second transistor is coupled to the drain of the first transistor. The drain of the second transistor is coupled to the clock input. The source of the second transistor is coupled to the second output of the dynamic shift register unit. The gate of the third transistor is coupled to the second input of the dynamic shift register unit. The drain of the third transistor is coupled to the gate of the second transistor. The source of the third transistor is coupled to the second output of the dynamic shift register unit. The gate of the fourth transistor is coupled to the second input of the dynamic shift register unit. The drain of the fourth transistor is coupled to the second output of the dynamic shift register unit. The source of the fourth transistor is coupled to the second reference line. The gate of the fifth transistor is coupled to the drain of the first transistor. The drain of the fifth transistor is coupled to the clock input. The source of the fifth transistor is coupled to the first output of the dynamic shift register unit. The gate of the sixth transistor is coupled to the second input of the dynamic shift register unit. The drain of the sixth transistor is coupled to the first output of the dynamic shift register unit. The source of the sixth transistor is coupled to the second reference line. Each dynamic shift register unit is configured to receive an input pulsed signal from the first input of the dynamic shift register unit, shift the received input pulses signal, and output the shifted pulsed signal through the output of the dynamic shift register unit. This output is received as input by the (N+1)-th dynamic shift register stage such that a plurality of sequentially phase shifted clock signals are generated. In one embodiment, at least one of the first transistor, the second transistor, the third transistor, the fourth transistor, the fifth transistor, and the sixth transistor comprises a MOS thin film transistor.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
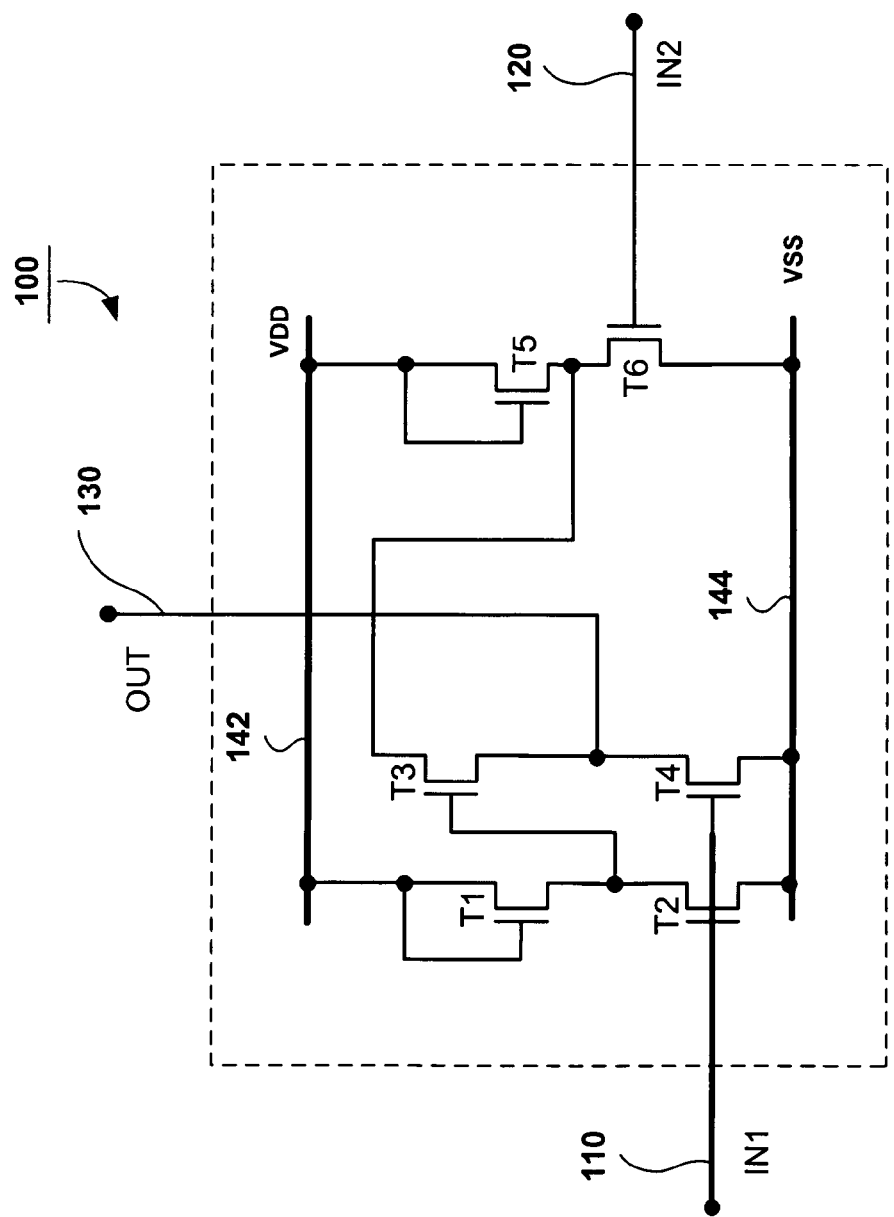
FIG. 1 shows a circuit diagram of a disable circuit for a shift register according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The description will be made as to the embodiments of the present invention in conjunction with the accompanying drawings in FIGS. 1-10. In accordance with the purposes of this invention, as embodied and broadly described herein, this invention, in one aspect, relates to a shift register with a built-in disable circuit.

Referring now to FIG. 1, a disable circuit 100 for a shift register is shown according to one embodiment of the present invention. In the embodiment, the disable circuit has a first input 110, a second input 120, an output 130, a first reference line 142 for receiving a first supply voltage $V_{DD}$, a second reference line 144 for receiving a second supply voltage $V_{SS}$, a first transistor T1, a second transistor T2, a third transistor T3, a fourth transistor T4, a fifth transistor T5 and a sixth transistor T6. The transistors T1 and T2 are used to form a first inverter for the first input 110 of the disable circuit 100. When the first input 110 receives a HIGH voltage level signal, the gate of transistor T2 turns to HIGH voltage level, which turns on the conductive path of the drain-source of the transistor T2 and the drain of the transistor T2 turns to LOW voltage level, which in turn, feeding a LOW voltage level signal to the output of the first inverter, i.e., the gate of the transistor T3. The LOW voltage level signal at the gate of the transistor T3 turns off the transistor T3. On the other hand, the HIGH voltage level signal at the first input 110 also turns on the gate of transistor T4 to the HIGH voltage level, which turns on the transistor T4 and the drain of the transistor T4 turns to the LOW voltage level. Therefore the output 130 will turn to LOW voltage level when the first input 110 turns to the HIGH voltage level.

The transistors T5 and T6 are used to form a second inverter. When the first input 110 turns to the LOW voltage level and the second input 120 turns to the HIGH voltage level, the output 130 turns to the LOW voltage level. When the first input 110 turns to the LOW voltage level and the second input 120 turns to the LOW voltage level, the output 130 turns to the HIGH voltage level. The disable circuit 100 is usually connected to a disable transistor and the pull-normal transistor of a shift register unit. The disable circuit 100 receives the input pulsed signal from the first input 110 of the disable circuit 100 and receives the output pulsed signal of this stage from the second input 120 to generate a disable pulsed signal, which controls the ON/OFF of the disable transistor and the pull-normal transistor of the shift register unit, via output 130. The generated disable pulsed signal is normally at a level that the disable transistor and the pull-normal transistor are turned ON. During the pulsed period of the input pulsed signal or the output pulsed signal, the generated disable pulsed signal is at another level that the disable transistor and the pull-normal transistor are turned OFF. The generated disable pulsed signal exists during the pulsed period of the input pulsed signal or the output pulsed signal and maintains the output signal of the shift register stage at the LOW voltage level at other time such that the output signal of the shift register stage is therefore disabled.

A dynamic shift register comprises a plurality of dynamic shift register stages 200 connected in serial, $\{S_N\}$, N=1, 2, ..., M, where M is a nonzero positive integer. Each of the plurality of dynamic shift register stages, $S_N$, has an input electrically connectable to an output of the (N−1)-th dynamic shift register stage, $S_{N-1}$, an output electrically connectable to an input of (N+1)-th dynamic shift register stage, $S_{N+1}$, a dynamic shift register unit and a disable circuit. The dynamic shift register further has a clock input CK, a first reference line $V_{DD}$ for receiving a first supply voltage, and a second reference line $V_{SS}$ for receiving a second supply voltage. The clock input CK, the first reference line $V_{DD}$ and the second reference line $V_{SS}$ are available for all components of the dynamic shift register. The dynamic shift register generates a plurality of sequentially phase shifted clock signals for a driving a display, such as an LCD, an electroluminescent display, or an organic light emitting diode display, etc.

Figure 2:
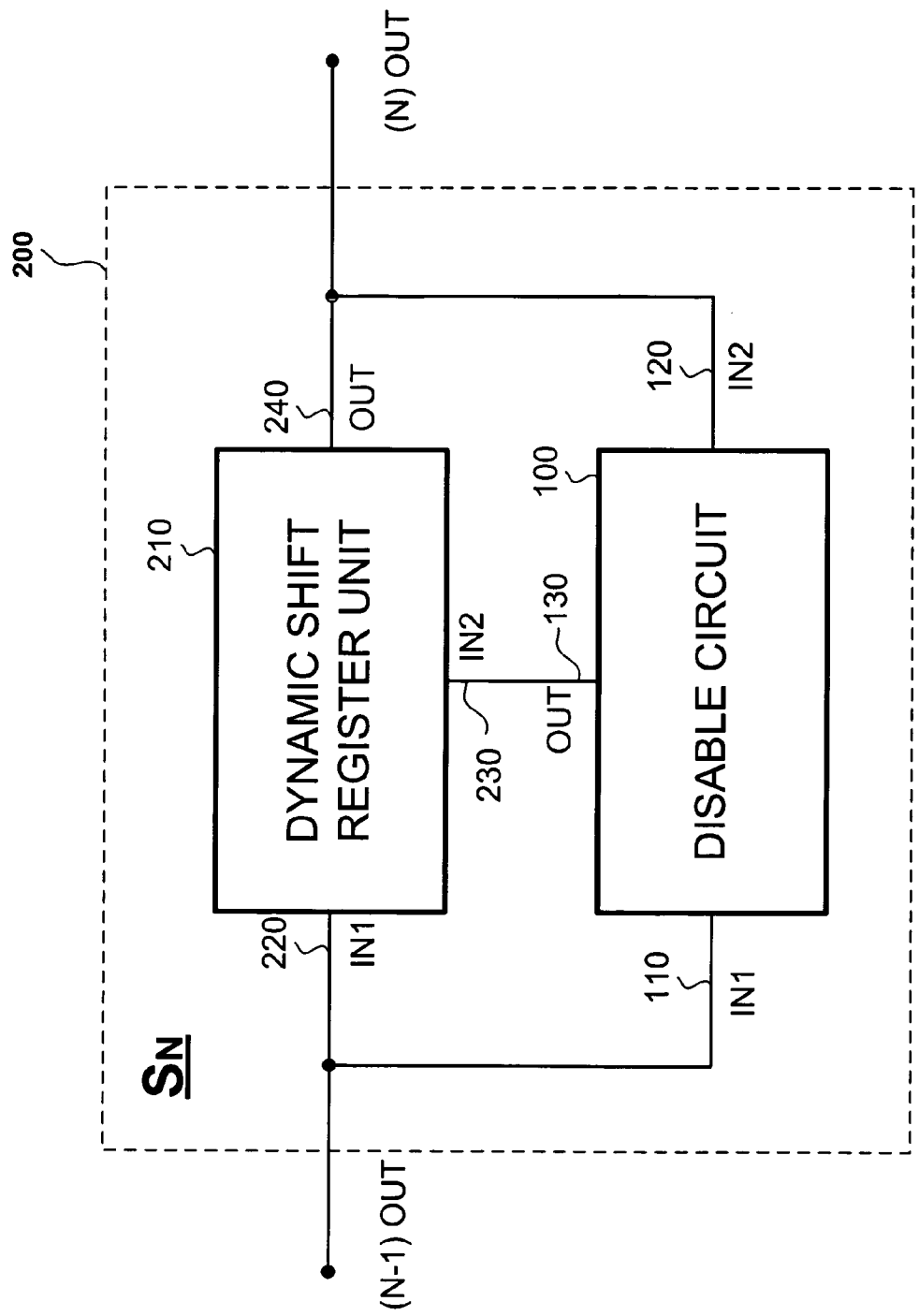
FIG. 2 shows a block diagram of a shift register stage with a shift register unit and a built-in disable circuit according to one embodiment of the present invention.

Now referring to FIG. 2, a block diagram of a shift register stage 200 is shown according to one embodiment of the present invention. The shift register stage 200 has a shift register unit 210 and a disable circuit 100. The shift register unit 210 has a first input 220, a second input 230 and an output 240. The disable circuit 100 has a first input 110, a second input 120 and an output 130. The first input 220 of the dynamic shift register unit 210 is coupled to the first input 110 of the disable circuit 100 to form an input of the shift register stage 200. The second input 230 of the dynamic shift register unit 210 is coupled to the output 130 of the disable circuit 100. The output 240 of the dynamic shift register unit 210 is coupled to the second input 120 of the disable circuit 100 to form an output of the current shift register stage 200.

Figure 3:
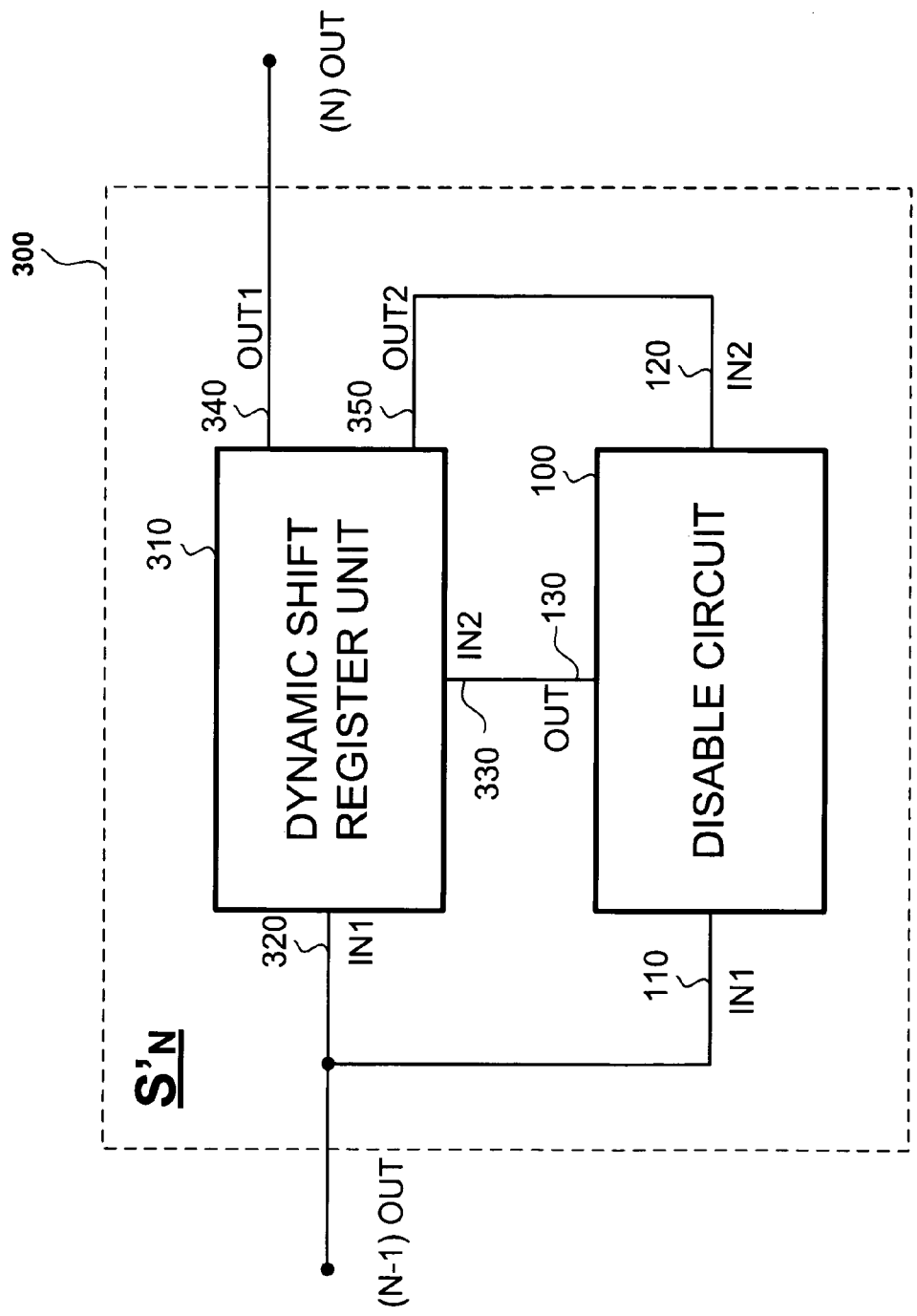
FIG. 3 shows a block diagram of a shift register stage with a shift register unit and a built-in disable circuit according to another embodiment of the present invention.

Now referring to FIG. 3, a block diagram of a shift register stage 300 is shown according to another embodiment of the present invention. The shift register stage 300 has a shift register unit 310 and a disable circuit 100. The shift register unit 310 has a first input 320, a second input 330, a first output 340 and a second output 350. The disable circuit 100 has a first input 110, a second input 120 and an output 130. The first input 320 of the dynamic shift register unit 310 is coupled to the first input 110 of the disable circuit 100 to form an input of the shift register stage 300. The second input 330 of the dynamic shift register unit 310 is coupled to the output 130 of the disable circuit 100. The second output 350 of the dynamic shift register unit 310 is coupled to the second input 120 of the disable circuit 100. The output of the shift register stage 300 is the first output 340 of the dynamic shift register unit 310.

Figure 4:
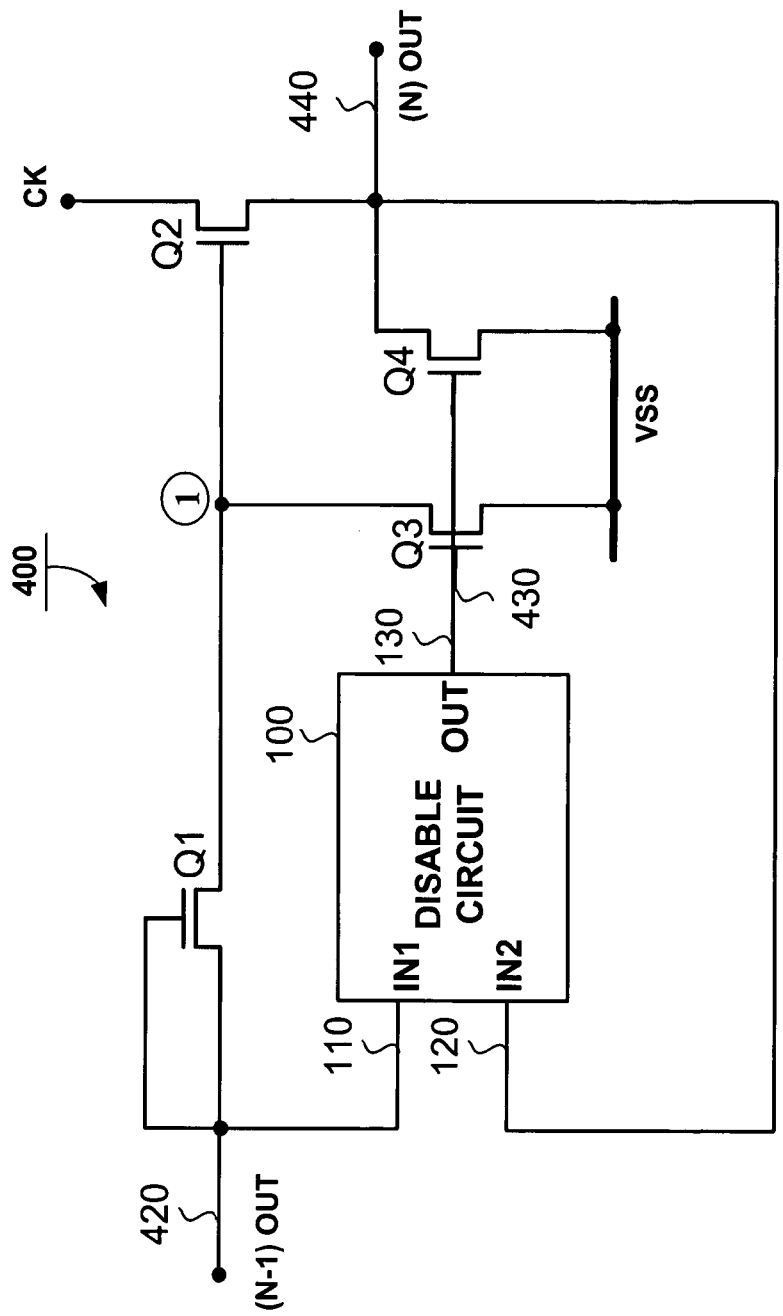
FIG. 4 shows a shift register unit circuit with a built-in disable circuit according to one embodiment of the present invention.
Figure 5:
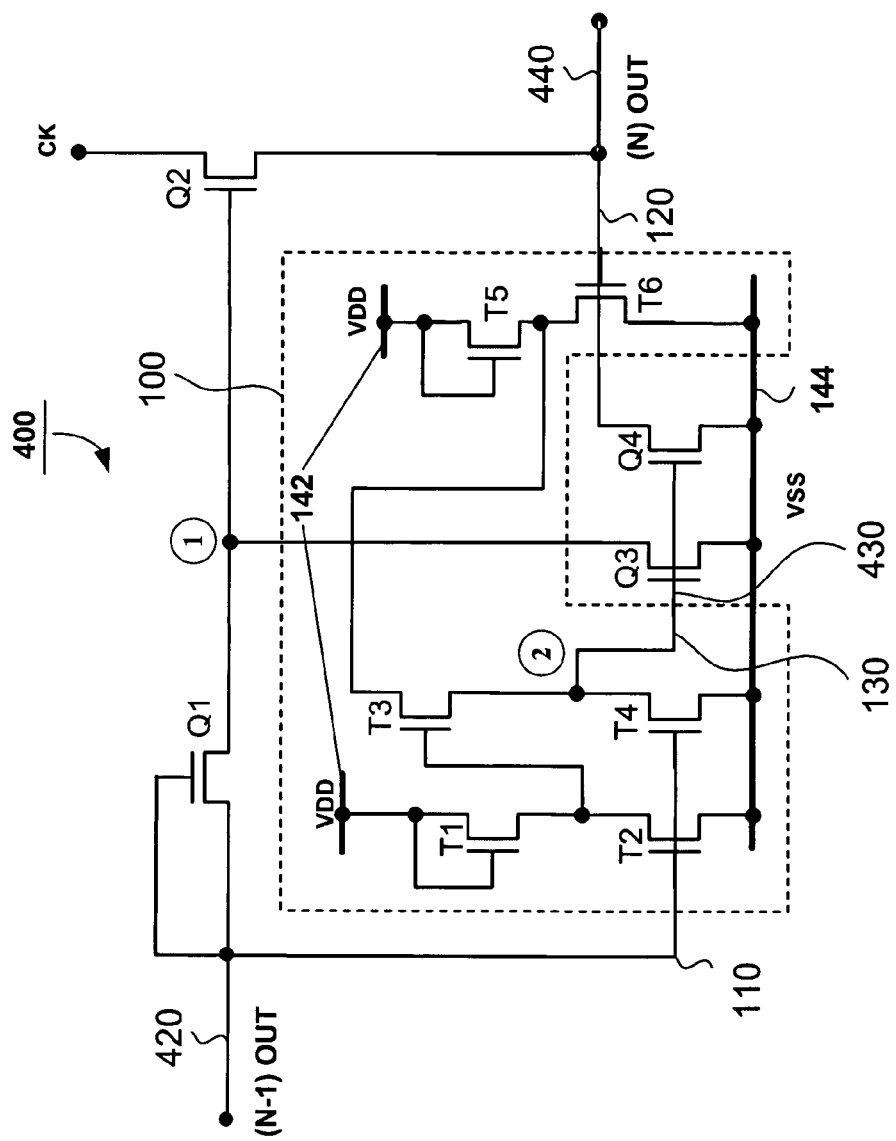
FIG. 5 shows the shift register unit circuit as shown in FIG. 4 with a detailed circuit of the built-in disable circuit.
Figure 6:
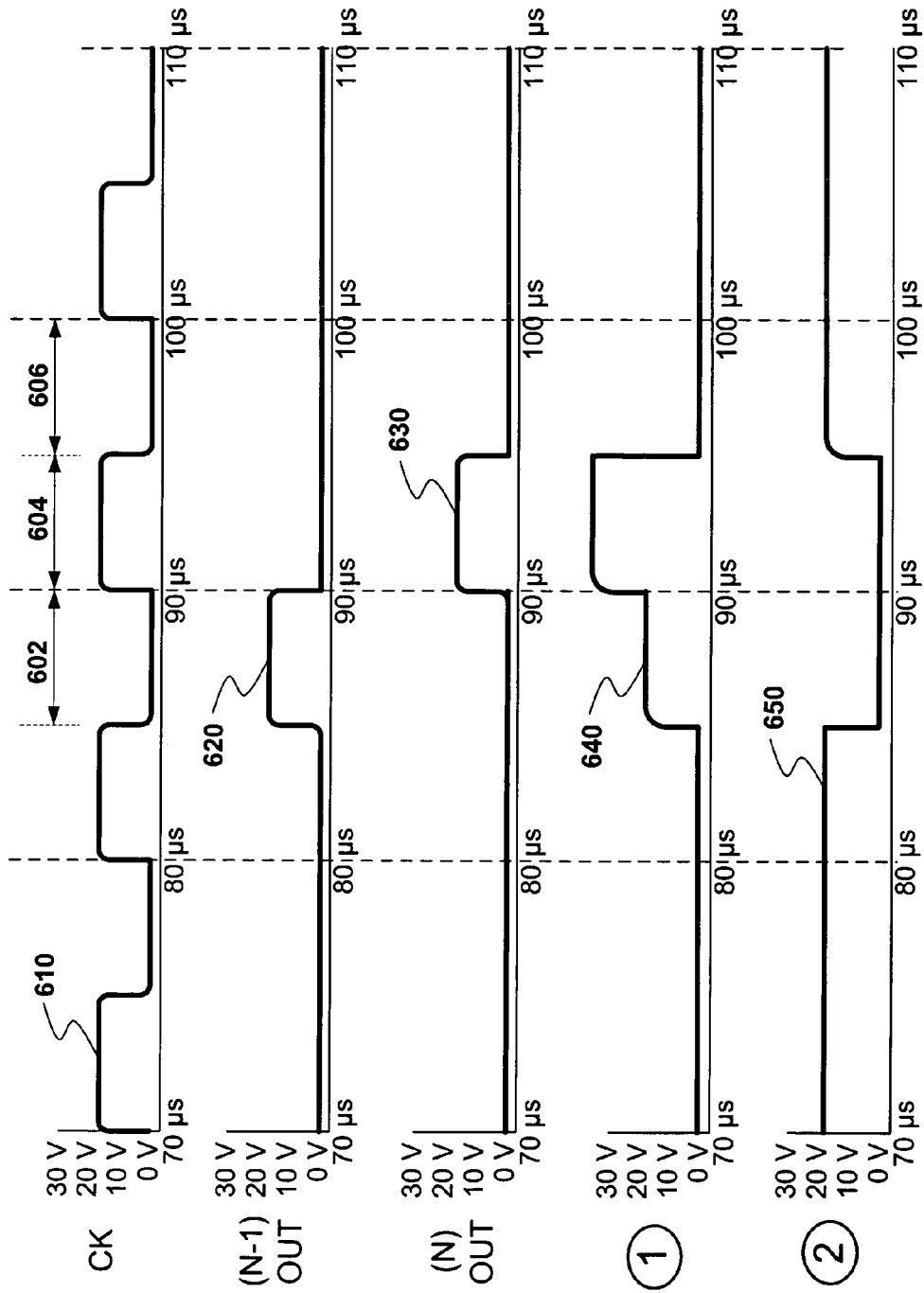
FIG. 6 shows a timing chart of a shift register stage with a built-in disable circuit according to one embodiment of the present invention.

Now referring to FIGS. 4, 5 and 6, a shift register stage 400 is shown in FIG. 4, the same shift register unit with a detailed disable circuit 100 is shown in FIG. 5 and its time chart is illustrated in FIG. 6, according to one embodiment of the present invention. The dynamic shift register stage 400 has a shift register unit and a disable circuit 100. The shift register unit has an input transistor Q1, an output transistor Q2, a disable transistor Q3, and a pull-normal transistor Q4, a first input 420, a second input 430, an output 440, a clock input CK, a first reference line 142 for receiving a first supply voltage $V_{DD}$ and a second reference line 144 for receiving a second supply voltage $V_{SS}$. The disable circuit 100 has a first inverter having two transistors T1 and T2, a second inverter having two transistors T5 and T6, and an output transistor T3, a pull-low transistor T4, a first input 110, a second input 120, and an output 130. The complementary wave form of the clock input CK is shown as 610 of FIG. 6. The input of the shift register stage 400 is the output of a prior stage shift register (N−1) OUT, while the input signal via the input of the shift register stage 400 is noted 620 shown in FIG. 6. At the start of time interval 602, when N-th shift register stage 400 receives the input signal, (N−1) OUT from the output of a prior (N−1)-th stage. The gate and the source of the input transistor Q1 are coupled to the HIGH voltage level and the voltage at the node 1 is charged to the HIGH voltage level to turn on the output transistor Q2 so that the clock input CK is transferred to the source of the output transistor Q2 that is the output of the (N)-th shift register stage. During the input pulse interval, the clock input CK is at low voltage so that (N) OUT is at the LOW voltage level as well.

In FIG. 5, node 2, coupled to the gates of the transistors Q3 and Q4, is the output of the built-in disable circuit 100 of the shift register stage 400. During the input pulse interval, the transistor T4 is turned on by the input pulsed signal and the transistor T3 is turned off by the inverted input pulse so that the node 2 is pulled to the LOW voltage level, as shown by the signal 650 of FIG. 6, to turn off the transistors Q3 and Q4, where the inverted input pulse is generated by a first inverter having the transistors T1 and T2.

After the input pulse swings to the LOW voltage level and the clock input CK swings to the HIGH voltage level, (N) OUT 440 of the shift register stage 400 follows the clock input CK swinging to the HIGH voltage level, as shown at the beginning of the time interval 604 in FIG. 6. Signal 640 of node 1 is thus boosted to a higher HIGH voltage level by voltage feed-through from the output 440 of the shift register stage 400 though the parasitic capacitance formed between the gate and the source of the transistor Q2, as shown in FIG. 6. When the input pulsed signal 620 is at normal LOW voltage level, as shown in FIG. 6, the transistor T4 is turned off and the transistor T3 is turned on so that the voltage level of node 2 is determined by the output of the second inverter circuit having the transistors T5 and T6. Since the input signal of the second inverter is (N) OUT 440 that is at HIGH voltage level now, node 2 remains at LOW voltage level to keep the transistors Q3 and Q4 at off state.

After the clock input CK swings from HIGH voltage level to LOW voltage level as shown at the beginning of the time interval 606 in FIG. 6, the output 440 of the shift register stage (N) OUT also swings from HIGH voltage level to LOW voltage level so that the output of the second inverter changes from LOW voltage level to HIGH voltage level, so does the voltage level of node 2, as shown in 650 of FIG. 6. In this situation, transistors Q3 and Q4 are to be turned on and then node 1 is pulled down to a LOW voltage level to turn off the output transistor Q2. Thereafter, the output 440 of the shift register stage 400 is kept at LOW voltage level through the pull-normal transistor Q4 by connecting to the low voltage source $V_{SS}$. Therefore, the output (N) OUT of the shift register stage 400 is a shifted single pulse 630 as shown in FIG. 6.

Same operation is repeated at each stage of the dynamic shift register circuit to produce a plurality of sequentially phase shifted clock signals.

Figure 7A:
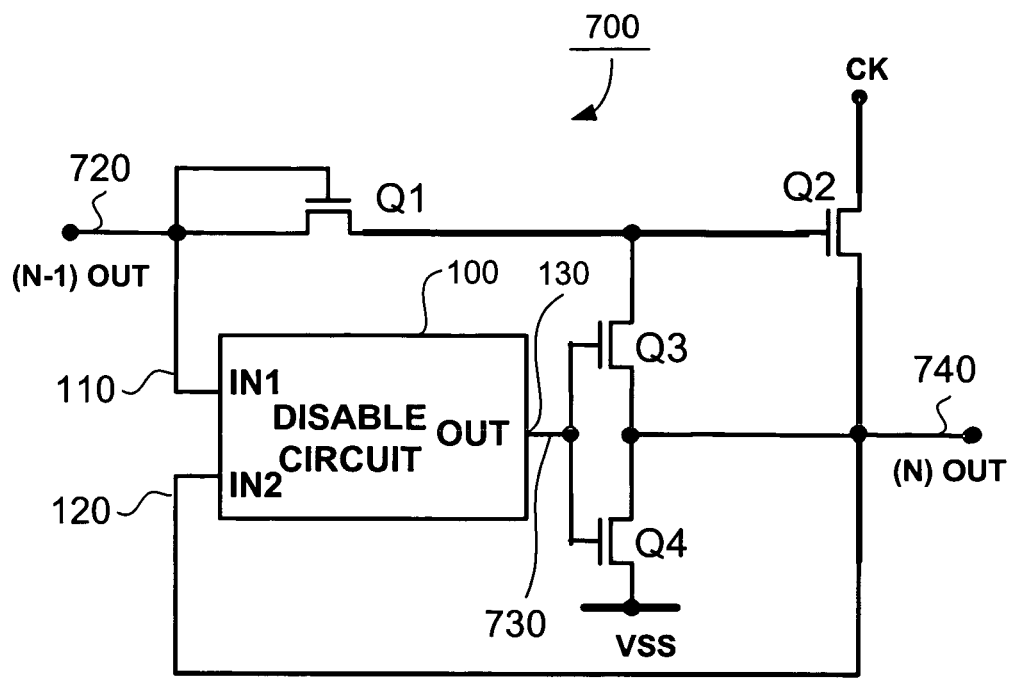
FIG. 7(a) shows a shift register unit circuit with a built-in disable circuit according to one embodiment of the present invention.
Figure 7B:
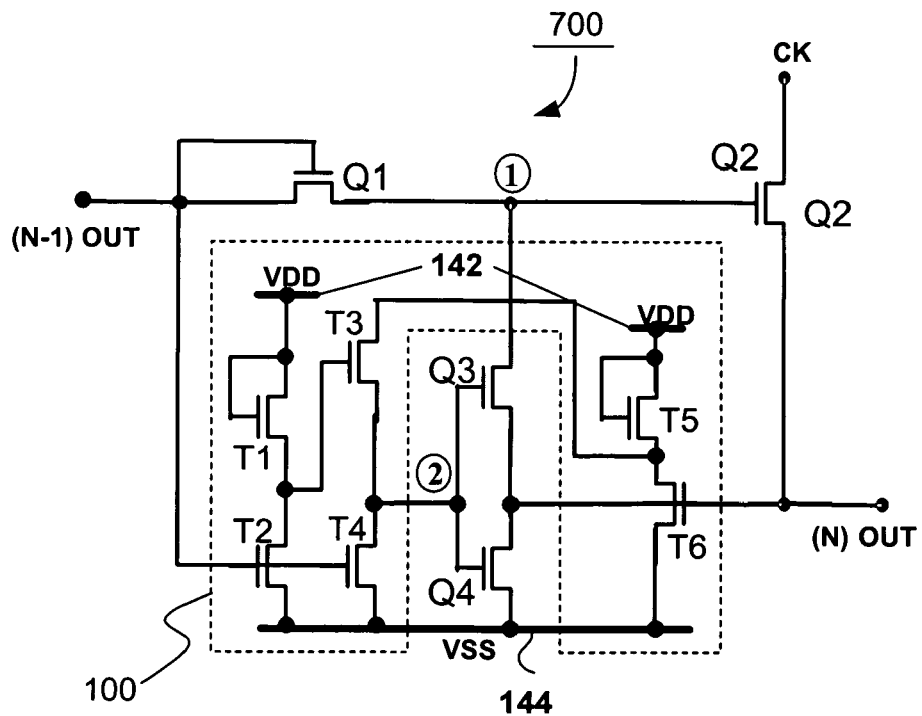
FIG. 7(b) shows the shift register unit circuit as shown in FIG. 7(a) with a detailed circuit of the built-in disable circuit.

Now referring to FIG. 7(a), and FIG. 7(b), a shift register stage 700 is shown in FIG. 7(a), and the same shift register stage with a detailed disable circuit 100 is shown in FIG. 7(b) according to another embodiment of the present invention. The dynamic shift register stage 700 has a shift register unit and a disable circuit 100. The shift register unit has an input transistor Q1, an output transistor Q2, a disable transistor Q3, and a pull-normal transistor Q4, a first input 720, a second input 730, an output 740, a clock input CK, a first reference line 142 for receiving a first supply voltage $V_{DD}$ and a second reference line 144 for receiving a second supply voltage $V_{SS}$. The disable circuit 100 has a first inverter having two transistors T1 and T2, a second inverter having two transistors T5 and T6, and an output transistor T3, a pull-low transistor T4, a first input 110, a second input 120, and an output 130.

This embodiment is a variation of the dynamic shift register 400 as described in detail earlier and shown in FIGS. 4 and 5. It operates under the similar principle and the description of its operation is therefore not repeated here.

Figure 8:
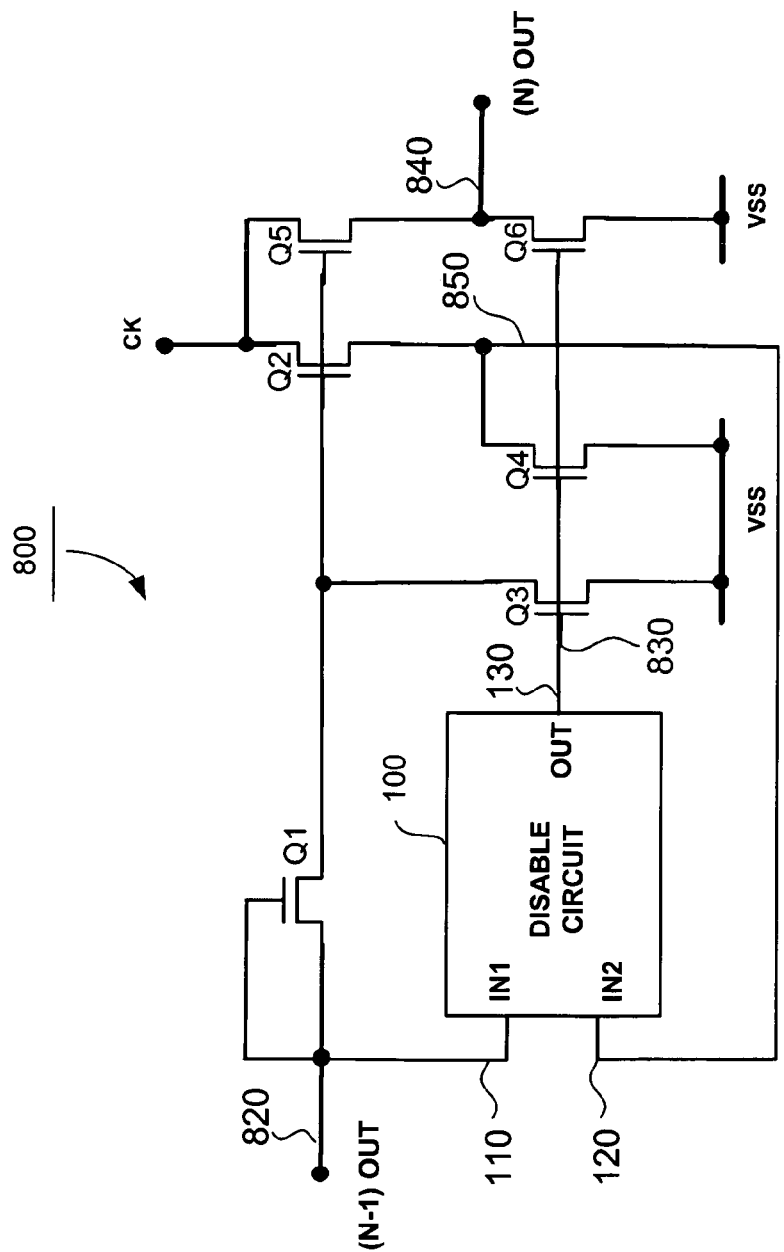
FIG. 8 shows a shift register unit circuit with a built-in disable circuit according to one embodiment of the present invention.

Now referring to FIG. 8, a shift register stage 800 is shown according to one embodiment of the present invention. The dynamic shift register stage 800 has a shift register unit and a disable circuit 100. The shift register unit has an input transistor Q1, a first output transistor Q2, a disable transistor Q3, a first pull-normal transistor Q4, a second output transistor Q5, a second pull-normal transistor Q6, a first input 820, a second input 830, a first output 840, a second output 850, a clock input CK, a first reference line 142 for receiving a first supply voltage $V_{DD}$ and a second reference line 144 for receiving a second supply voltage $V_{SS}$. The disable circuit 100 has a first inverter having two transistors T1 and T2, a second inverter having two transistors T5 and T6, and an output transistor T3, a pull-low transistor T4, a first input 110, a second input 120, and an output 130. This is an embodiment having a dynamic shift register stage 300 as shown in FIG. 3. The input of the shift register stage ($S_N$) 800 is the output of a prior stage shift register (N−1) OUT, i.e., 820. When N-th shift register stage 800 receives a input pulsed signal, (N−1) OUT from the output of a prior (N−1)-th stage, $S_{N-1}$, the gate and the source of the transistor Q1 are coupled to the HIGH voltage level and the voltage at the gate of the transistor Q5 is charged to the HIGH voltage level to turn on the transistor Q5 so that the clock input CK is transferred to the source of the transistor Q5 that is the output node of the (N)-th shift register stage 800. During the input pulse interval, the clock input CK is at low voltage so that (N) OUT is at the LOW voltage level as well.

The output of the built-in disable circuit 100 of the shift register stage 800 is coupled to the gates of the transistors Q3, Q4 and Q6. During the input pulse interval, the first input 110 of the disable circuit 100 is turned on by the input pulse and the output 130 of the disable circuit 100 is turned to LOW voltage level to turn off the transistors Q3, Q4 and Q6.

After the input pulse swings to the LOW voltage level and the clock input CK swings to the HIGH voltage level, the first output 840 and the second output 850 of the shift register stage 800 follow the CK signal swinging to HIGH voltage level. When the input pulse signal is at normal LOW voltage level, the output 130 of the disable circuit 100 is determined by the output of inverse of the second input 120 of the disable circuit 100. Since the inverse of the second input 120 of the disable circuit 100 is at HIGH voltage level now, the output 130 remains at LOW voltage level to keep the transistors Q3, Q4 and Q6 at off state.

After the clock input CK swings from HIGH voltage level to LOW voltage level, the first output 840 of the shift register stage 800 and the second output 850 also swing from HIGH voltage level to LOW voltage level so that the output 130 of the disable circuit 100 changes from LOW voltage level to HIGH voltage level. In this situation, transistors Q3, Q4 and Q6 are to be turned on and then the gate of the transistor Q2 is pulled down to a LOW voltage level to turn off the transistor Q2. Thereafter, the output 840 of the shift register stage 800 is kept at LOW voltage level through the transistor Q6 by coupling to the low voltage source $V_{SS}$.

Same operation is repeated at each stage of the dynamic shift register to produce a plurality of sequentially phase shifted clock signals.

Figure 9:
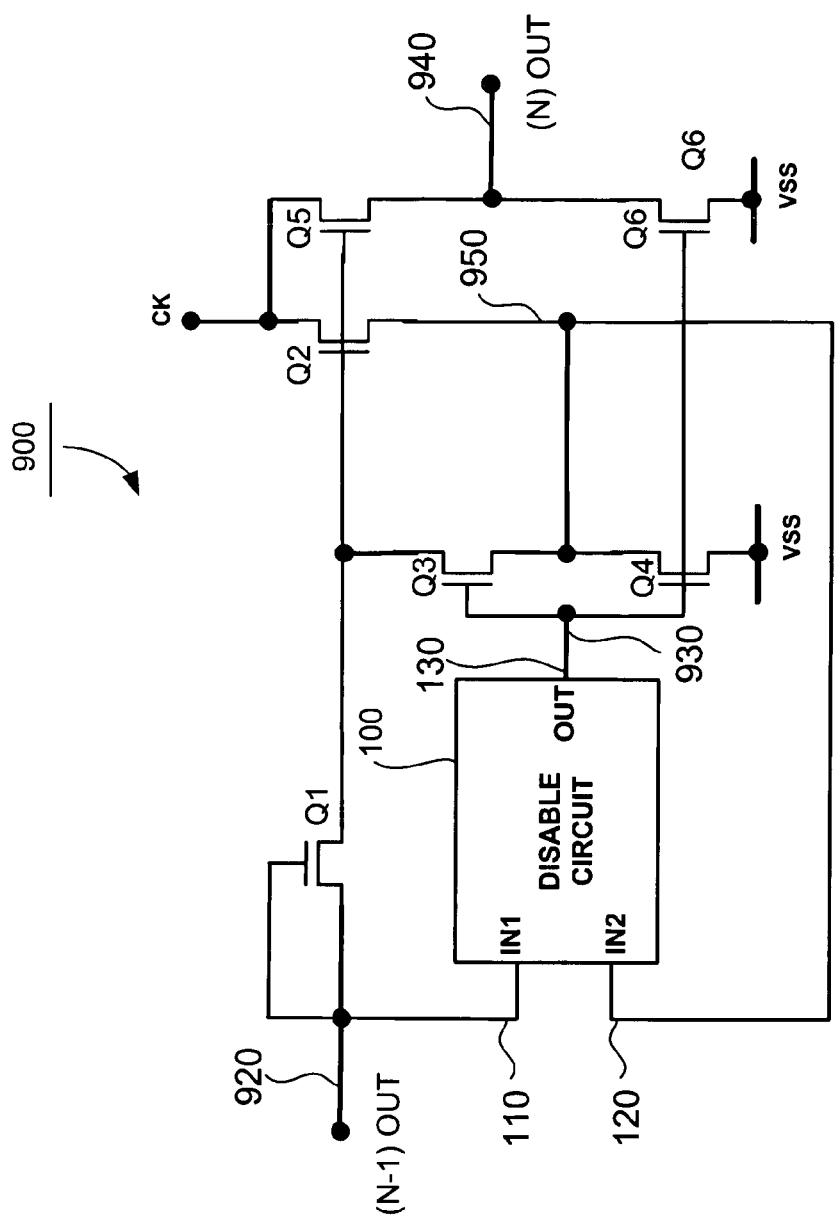
FIG. 9 shows a shift register unit circuit with a built-in disable circuit according to another embodiment of the present invention.

Another dynamic shift register stage 900 having the structure of dynamic shift register stage 300 as illustrated in FIG. 3 is shown in FIG. 9 according to another embodiment of the present invention. The dynamic shift register stage 900 has a shift register unit and a disable circuit 100. The shift register unit has an input transistor Q1, a first output transistor Q2, a disable transistor Q3, a first pull-normal transistor Q4, a second output transistor Q5, a second pull-normal transistor Q6, an first input 920, a second input 930, a first output 940, a second output 950, a clock input CK, a first reference line 142 for receiving a first supply voltage $V_{DD}$ and a second reference line 144 for receiving a second supply voltage $V_{SS}$. The disable circuit 100 has a first inverter having two transistors T1 and T2, a second inverter having two transistors T5 and T6, and an output transistor T3, a pull-low transistor T4, a first input 110, a second input 120, and an output 130. This embodiment is a variation of the dynamic shift register 800 as described in detail earlier and shown in FIG. 8. It operates under the similar principle and the description of its operation is therefore not repeated here.

Comparing to the dynamic shift register stages 400 and 700, two more transistors Q5 and Q6 are added to the dynamic shift register stages 800 and 900, which separates the output (N) OUT of the stage from the second input 120 of the disable circuit 100. Such arrangement enhances the stability of the dynamic shift register. These two embodiments are suitable for heavy output capacitive load.

Figure 10:
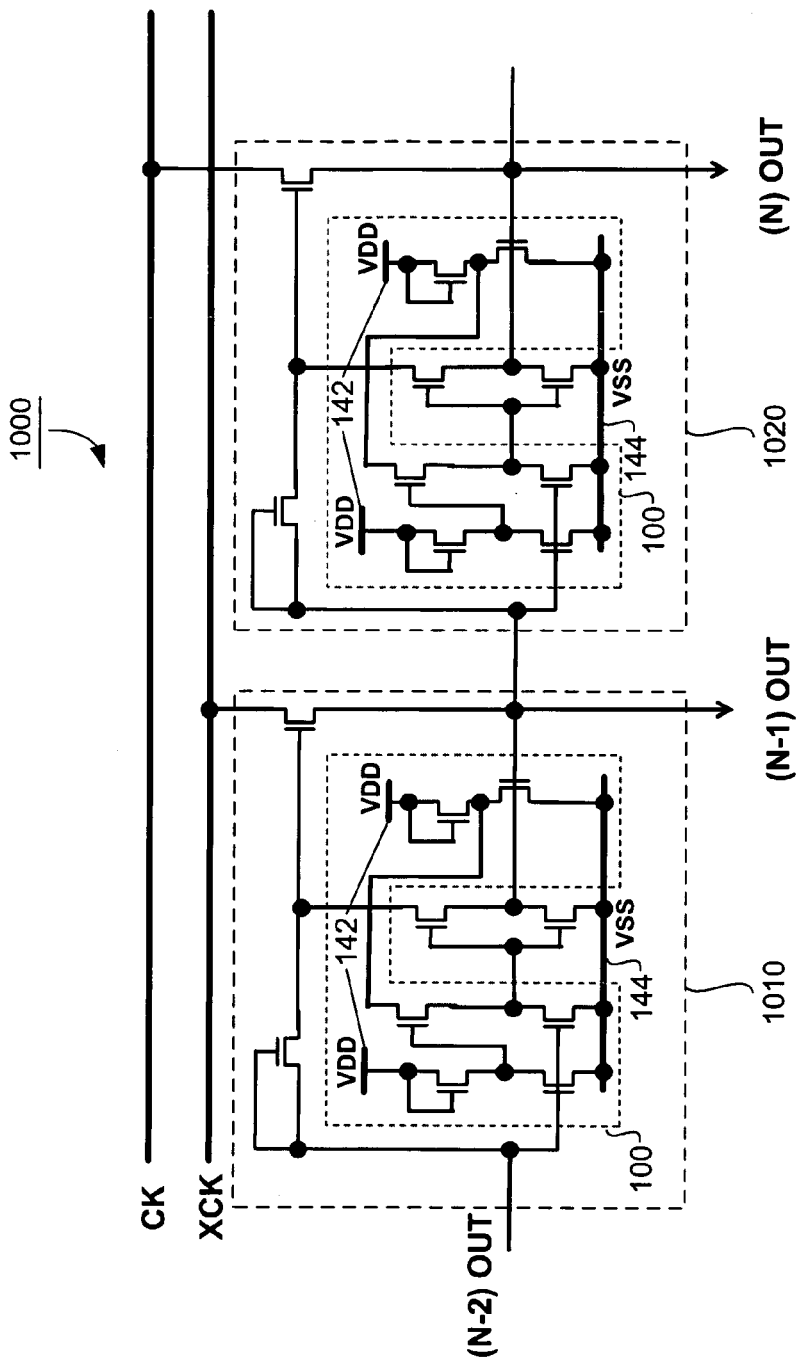
FIG. 10 shows serially connected two shift register stage circuits with built-in disable circuits according to one embodiment of the present invention.
Figure 11:
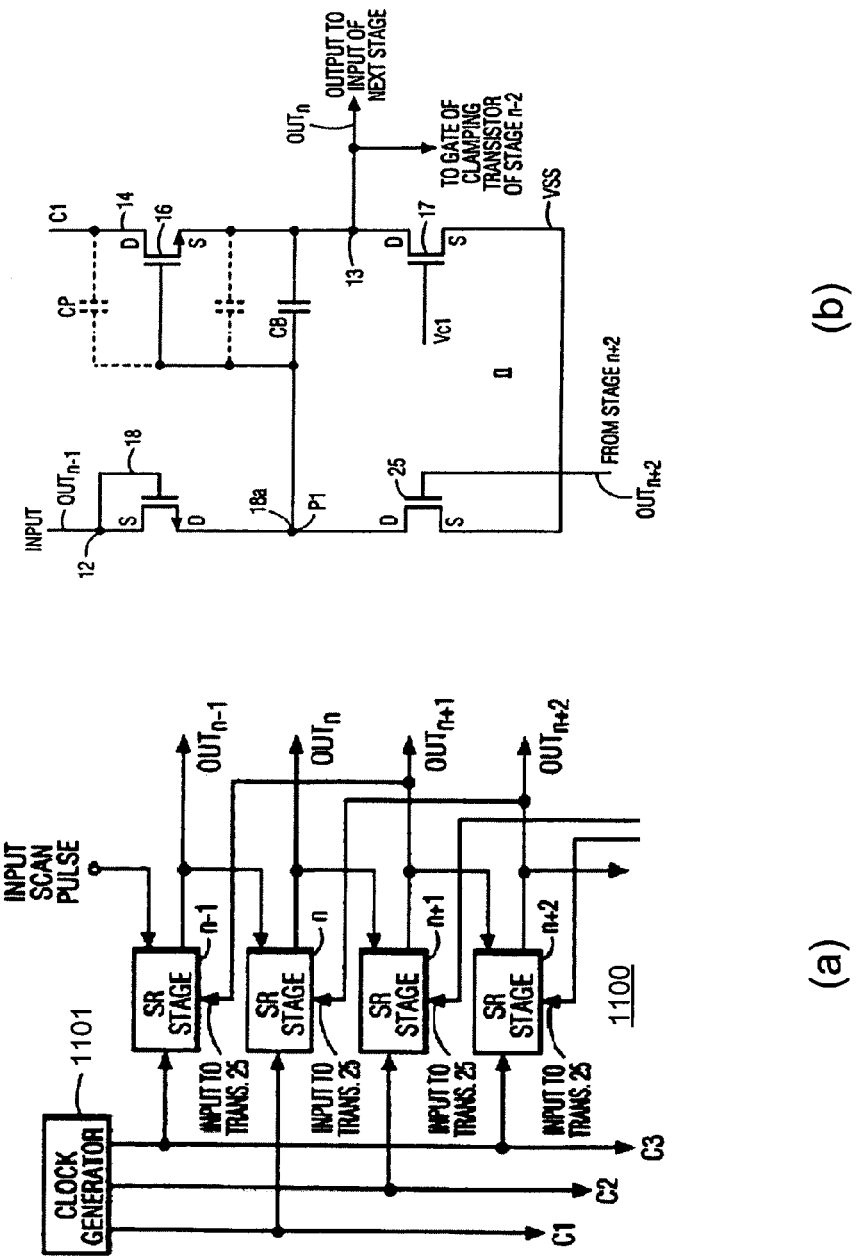
FIGS. 11(*a*) and 11(*b*) show a block diagram of a related art shift register including a plurality of cascaded stages and a detailed shift register stage circuit, respectively.
Figure 12:
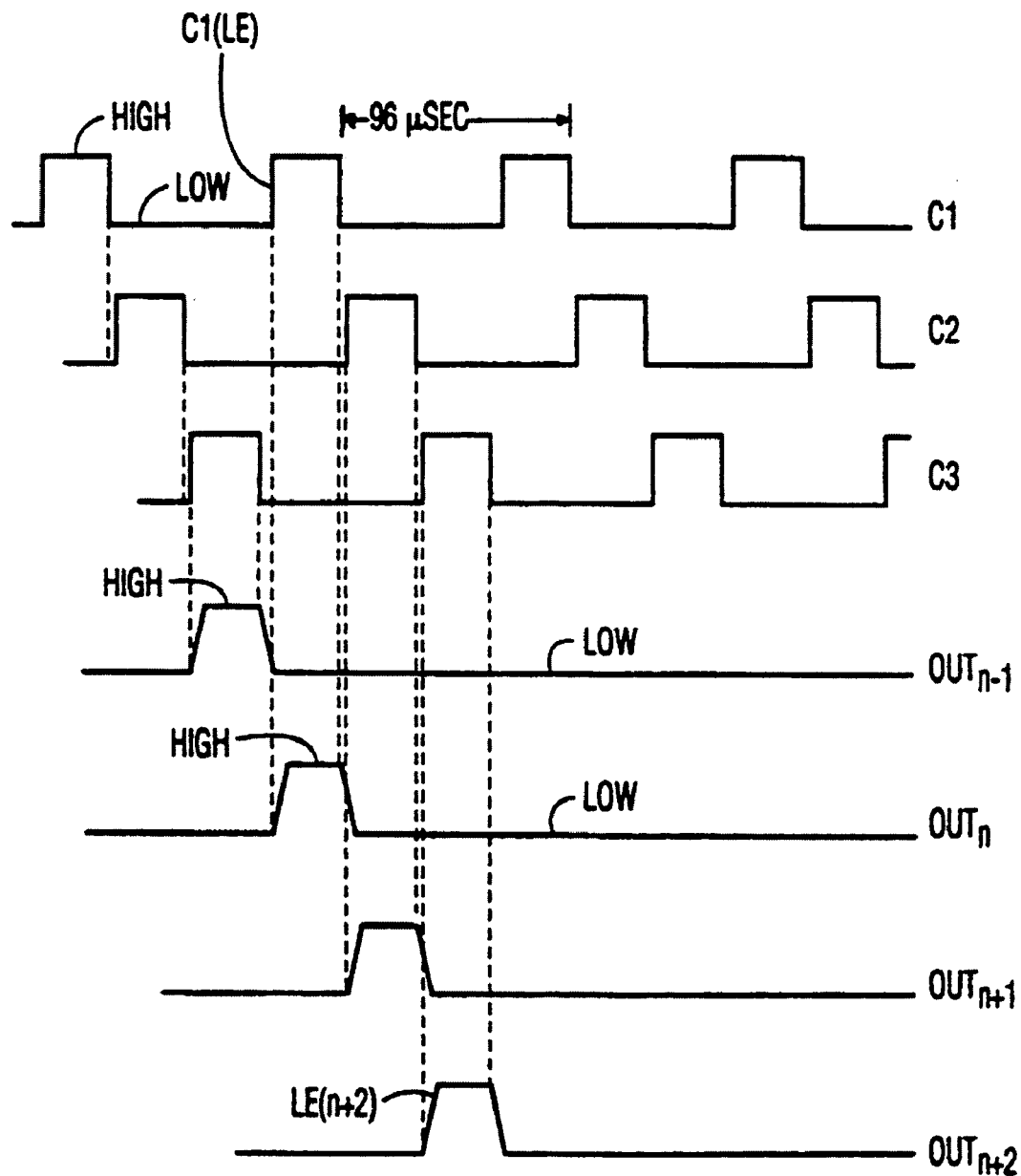
FIG. 12 is a diagram of the relative timing of the output signals and respective clock signals occurring at respective nodes of a conventional shift register shown in FIG. 11(*a*).

Since a complementary clock input CK is used, for two consecutive shift register stages, $S_{N-1}$ and $S_N$, for example, the output of their stages are turned on or off at different edges of the clock input CK. If the output of a (N−1)-th shift register stage $S_{N-1}$ is turned on at the raising edge of the clock input CK, then the output of the N-th stage $S_N$ will be turned on at the dropping edge of the clock input CK. As an alternative, another clock input XCK that is an inverse of the clock input CK is introduced in the portion of a dynamic shift register 1000 as shown in FIG. 10. In this embodiment, the first clock input CK and the second clock input XCK are alternately received by the dynamic shift register stages such that if the (N−1)-th dynamic shift register stage $S_{N-1}$ receives the first clock input CK, the N-th dynamic shift register stage $S_N$ receives the second clock input XCK, and vice versa. In FIG. 10, the (N−1)-th shift register stage 1010 and the N-th shift register stage 1020 are shown. The (N−1)-th shift register stage 1010 is coupled to the inverse clock input XCK and the N-th shift register stage 1020 is coupled to the clock input CK. In such an embodiment, the output signals of all stages are turn on or off at exactly the same edge, either raising or dropping edge of the clock input CK and the inverse clock input XCK. The consistency and stability of the dynamic shift register circuit may be increased with such modification.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A dynamic shift register comprising a plurality of dynamic shift register stages connected in serial, $\{S_N\}$, N=1, 2, . . . , M, M being a nonzero positive integer, wherein the N-th dynamic shift register stage, $S_N$, comprises:
   (i). an input electrically connected to an output of the (N−1)-th dynamic shift register stage, $S_{N-1}$;
   (ii). an output electrically connected to an input of (N+1)-th dynamic shift register stage, $S_{N+1}$;
   (iii). a first reference line for receiving a first supply voltage, and a second reference line for receiving a second supply voltage;
   (iv). a dynamic shift register unit having a first input coupled to the input of the dynamic shift register stage $S_N$ for receiving an input pulsed signal, a second input for receiving a control signal, and an output coupled to the output of the dynamic shift register stage $S_N$;
   (v). a disable circuit having a first input coupled to the first input of the dynamic shift register unit, a second input coupled to the output of the dynamic shift register unit, and an output coupled to the second input of the dynamic shift register unit, wherein the disable circuit further comprises:
      a. a first transistor having a gate, a drain and a source, wherein the gate is coupled to the drain, and the drain is coupled to the first reference line;
      b. a second transistor having a gate, a drain and a source, wherein the gate is coupled to the first input of the disable circuit, the drain is coupled to the source of the first transistor, and the source is coupled to the second reference line;
      c. a third transistor having a gate, a drain and a source, wherein the gate is coupled to the source of the first transistor and the drain of the second transistor, and the source is coupled to the output of the disable circuit;
      d. a fourth transistor having a gate, a drain and a source, wherein the gate is coupled to the first input of the disable circuit, the drain is coupled to the source of the third transistor and coupled to the output of the disable circuit, and the source is coupled to the second reference line;
      e. a fifth transistor having a gate, a drain and a source, wherein the gate is coupled to the drain, and the drain is coupled to the first reference line and the source is coupled to the drain of the third transistor; and
      f. a sixth transistor having a gate, a drain and a source, wherein the gate is coupled to the second input of the disable circuit, the drain is coupled to the drain of the third transistor and the source of the fifth transistor, and the source is coupled to the second reference line.

2. The dynamic shift register of claim 1, wherein the disable circuit is configured to generate an output signal during an input pulse period or an output pulse period for the dynamic shift register unit, wherein the input pulse period and the output pulse period are responsive to a first input signal from the first input and a second input signal from the second input, respectively.

3. The dynamic shift register of claim 1, wherein at least one of the first transistor, the second transistor, the third transistor, the fourth transistor, the fifth transistor, and the sixth transistor comprises a MOS thin film transistor.

4. The dynamic shift register of claim 1, further comprising a clock input, wherein the dynamic shift register unit comprises:
  a. a first transistor having a gate, a source and a drain, wherein the gate and the source are coupled to the first input of the dynamic shift register unit;
  b. a second transistor having a gate, a source and a drain, wherein the gate is coupled to the drain of the first transistor, the drain is coupled to the clock input, and the source is coupled to the output of the dynamic shift register unit;
  c. a third transistor having a gate, a source and a drain, wherein the gate is coupled to the second input of the dynamic shift register unit, the drain is coupled to the gate of the second transistor, and the source is coupled to the second reference line; and
  d. a fourth transistor having a gate, a source and a drain, wherein the gate is coupled to the second input of the dynamic shift register unit, the drain is coupled to the output of the dynamic shift register unit, and the source is coupled to the second reference line, wherein the dynamic shift register unit is configured to:
  receive an input pulsed signal from the first input of the dynamic shift register unit, shift the received input pulsed signal, and
  output an output signal, through the output of the dynamic shift register unit, to be received as an input by the (N+1)-th dynamic shift register stage such that a plurality of sequentially phase shifted clock signals are generated.

5. The dynamic shift register of claim 4, wherein at least one of the first transistor, the second transistor, the third transistor, and the fourth transistor comprises a MOS thin film transistor.

6. A dynamic shift register comprising a plurality of dynamic shift register stages connected in serial, $\{S_N\}$, N=1, 2, ..., M, M being a nonzero positive integer, wherein the N-th dynamic shift register stage, $S_N$ comprises:
  (i). an input electrically connectable to an output of the (N−1)-th dynamic shift register stage, $S_{N-1}$;
  (ii). an output electrically connectable to an input of the (N+1)-th dynamic shift register stage, $S_{N+1}$;
  (iii). a first reference line for receiving a first supply voltage, and a second reference line for receiving a second supply voltage;
  (iv). a dynamic shift register unit having a first input coupled to the input of the dynamic shift register stage $S_N$ for receiving an input pulsed signal, a second input for receiving a control signal, a first output coupled to the first output of the dynamic shift register stage $S_N$ for outputting a first shifted input pulsed signal, and a second output; and
  (v). a disable circuit having a first input coupled to the first input of the dynamic shift register unit, a second input coupled to the second output of the dynamic shift register unit, and an output coupled to the second input of the dynamic shift register unit, wherein the disable circuit further comprises:
    a. a first transistor having a gate, a drain and a source, wherein the gate is coupled to the drain, and the drain is coupled to the first reference line;
    b. a second transistor having a gate, a drain and a source, wherein the gate is coupled to the first input of the disable circuit, the drain is coupled to the source of the first transistor, and the source is coupled to the second reference line;
    c. a third transistor having a gate, a drain and a source, wherein the gate is coupled to the source of the first transistor and the drain of the second transistor, and the source is coupled to the output of the disable circuit;
    d. a fourth transistor having a gate, a drain and a source, wherein the gate is coupled to the first input of the disable circuit, the drain is coupled to the source of the third transistor and coupled to the output of the disable circuit, and the source is coupled to the second reference line;
    e. a fifth transistor having a gate, a drain and a source, wherein the gate is coupled to the drain, and the drain is coupled to the first reference line and the source is coupled to the drain of the third transistor; and
    f. a sixth transistor having a gate, a drain and a source, wherein the gate is coupled to the second input of the disable circuit, the drain is coupled to the drain of the third transistor and the source of the fifth transistor, and the source is coupled to the second reference line.

7. The dynamic shift register of claim 6, wherein the disable circuit is configured to generate an output signal during an input pulse period or an output pulse period for the dynamic shift register unit, wherein the input pulse period and the output pulse period are responsive to a first input signal from the first input and a second input signal from the second input, respectively.

8. The dynamic shift register of claim 6, wherein at least one of the first transistor, the second transistor, the third transistor, the fourth transistor, the fifth transistor, and the sixth transistor comprises a MOS thin film transistor.

* * * * *